United States Patent [19]

Brown, III

[11] Patent Number: 5,023,813
[45] Date of Patent: Jun. 11, 1991

[54] NON-VOLATILE MEMORY USAGE

[75] Inventor: John K. Brown, III, Lexington, Ky.

[73] Assignee: International Business Machines Corporation, Armonk, N.Y.

[21] Appl. No.: 389,028

[22] Filed: Aug. 3, 1989

[51] Int. Cl.$^5$ .......................................... G06K 15/00
[52] U.S. Cl. ............................... 364/519; 364/944.92; 364/900
[58] Field of Search ............................... 364/518–521, 364/944, 92 MS, 235 MS, 930 MS; 371/10.1, 10.2, 37.1, 40.1, 40.3, 41

[56] References Cited

U.S. PATENT DOCUMENTS

| | | | |
|---|---|---|---|
| 4,586,147 | 4/1986 | Tadokoro | 364/550 |
| 4,751,703 | 6/1988 | Picon et al. | 371/10.1 |
| 4,803,707 | 2/1989 | Cordan, Jr. | 377/24.1 |

Primary Examiner—Arthur G. Evans
Attorney, Agent, or Firm—John J. McArdle, Jr.

[57] ABSTRACT

A page printer including a print engine (15) and a controller (11) which includes a non-volatile memory (16) having an EEPROM (17) and a chip RAM (18). A microprocessor (12) under program control manages the placement of data in the EEPROM (17) of the non-volatile memory (16). The EEPROM (17) and the associated chip RAM (18) are structured to have a control block (31) and a data storage portion (32–39). The control block (31) includes pointers (41–47) indicating the locations in the non-volatile memory where data is stored. If a data location becomes faulty, the value of the pointer to that location is changed so that the pointer points to a previously unused portion of the non-volatile memory.

6 Claims, 11 Drawing Sheets

NON-VOLATILE MEMORY USAGE

FIELD OF THE INVENTION

This invention relates generally to non-volatile memory devices and more particularly concerns a system for the effective use of such memory. The invention is disclosed in relation to an electrophotographic page printer in which the non-volatile memory maintains user and printer parameters and a printed page counter.

BACKGROUND OF THE INVENTION

In various types of electronic systems, there is a need to retain some information across power cycles or during times of the interruption of power to the system. Often, in electronic data processing equipment, non-volatile memory is used for this purpose. The non-volatile memory may take the form of a non-volatile random access memory (NVRAM), which typically includes an erasable electrically programmable read only memory (EEPROM). The EEPROM is contained on an NVRAM chip, which also has a chip RAM used for transferring data to and from the EEPROM. The EEPROM is limited in the number of data storage operations which require a change of the data stored in the EEPROM.

An NVRAM chip contains a number of bits of storage, and the number of change operations for each bit is limited. An NVRAM chip may be specified as permitting 5,000 change operations at each bit location, for example.

In the case of an electrophotographic page printer, it is desirable to maintain a page count, indicative of the number of pages printed on the printer. This information can be of use in servicing the printer, for example.

A page counter for a printer will have a least significant digit which changes frequently, and the bits used in an NVRAM to maintain this digit change quickly. Therefore, in the case of a 5,000 change life for an NVRAM storage location, the implementation of a page counter capable of counting hundreds of thousands of pages is not directly possible.

One solution to this count limitation problem would be to employ NVRAM capable of a greater number of change operations, but such NVRAM is not readily and affordably available. Another solution would be to change the NVRAM chip at the end of its rated lifetime, but this is impractical due to the cost and inconvenience of making such changes.

Another technique would be to employ an NVRAM having many times the number of storage locations which are needed to store the data to be saved. Then, in the case of a counter for example, as bit storage locations reach their rated limit of change operations, the system employing the NVRAM can move data to new storage locations in the NVRAM. This approach is implemented in an electronic odometer described in U.S. Pat. No. 4,803,707.

The employment of this solution to the NVRAM life problem requires an application in which the data of concern are the less significant digits of a counter of some type so that the circuitry employing the NVRAM inherently can determine the number of changes to the less significant digits based on the count in the more significant digits. This solution also ignores the possibilities of NVRAM storage locations enduring for greater or fewer data change operations than that for which they are rated.

It is the general aim of the invention to provide an improved non-volatile memory management system in systems of the foregoing type which overcomes the stated disadvantages.

As will be described subsequently with regard to an exemplary embodiment, the invention will find advantageous use in electrophotographic page printers in which printer information as well as a count of printed pages are maintained in non-volatile memory.

SUMMARY OF THE INVENTION

In one embodiment of the invention, the improved non-volatile memory handling system takes the form of a page printer controller which includes non-volatile memory allocated to have a control block portion and a data portion. The controller stores data in the data portion in the non-volatile memory at locations indicated by pointers contained in the control block portion of the non-volatile memory. If a data storage error occurs, the controller changes the associated control block pointer to indicate a new data storage location in the data portion of the non-volatile memory and then writes the data to this new location.

It is an advantage of the invention that recovery from a data storage error occurs without operator intervention or a change of the controller electrical connections or components.

Further objects and advantages of the invention, and the manner of their implementation, will become apparent upon reading the following detailed description and upon reference to the drawings, in which:

DESCRIPTION OF THE PREFERRED EMBODIMENT

While the invention is susceptible to various modifications and alternative forms, a specific embodiment thereof has been shown by way of example in the drawngs and will herein be described in detail. It should be understood, however, that it is not intended to limit the invention to the particular form disclosed, but the intention is to cover all modifications, equivalents and alternatives falling within the spirit and scope of the invention, as defined by the appended claims.

Figure 1:
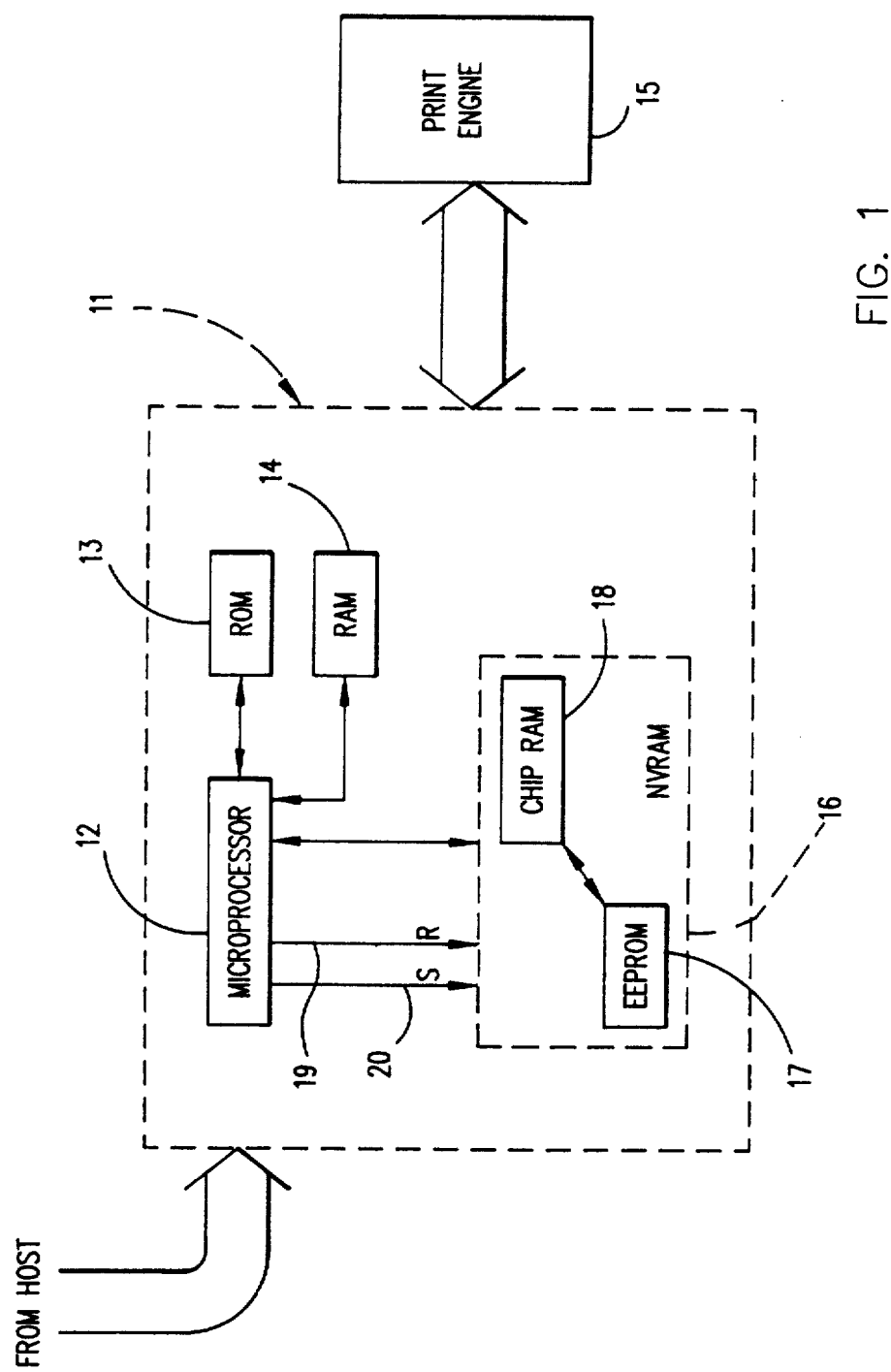
FIG. 1 is a schematic block diagram of a page printer engine and controller embodying the present invention.

Referring first to FIG. 1, a laser page printer includes a printer controller 11 containing a microprocessor 12 and associated read only memory (ROM) 13 and random access memory (RAM) 14. The ROM 13 contains the instructions executed by the microprocessor 12 to cooperate with the balance of the controller 11 to control a print engine 15 of the page printer in response to commands and data received from a host computer. The print engine 15 is the non-controller portion of the page printer, including, in the present instance, a laser printhead driven by the controller 11, a photoconductor, developer material, a drive motor, and so on. The microprocessor 12 is a Motorola 68000 microprocessor in the illustrated printer.

The RAM 14 in the controller 11 stores user and print engine information, and page buffer and bit map information for effecting printing by the print engine. The user information includes user default values for the paper source and the paper size for each source. The user information also includes a designation of the default font to be used by the printer. The print engine information, or parameters, include the values for setting the margins of the printing on a page. To preserve certain information to be available each time the controller 11 is powered on, an NVRAM chip 16 is included in the controller. The NVRAM chip 16 includes an EEPROM 17 and a chip RAM 18.

The microprocessor 12 is capable of addressing the chip RAM 18 in the same manner as it addresses the RAM 14. When the controller 11 is powered on, the permanently stored information in the EEPROM 17 can be written from the EEPROM 17 to the chip RAM 18 in response to a recall strobe signal on a line 19 from the microprocessor 12 to the NVRAM 16. Similarly, the information in the chip RAM 18 can be written to the EEPROM 17 in response to the activation of a store strobe on a line 20 by the microprocessor 12.

Figure 2:
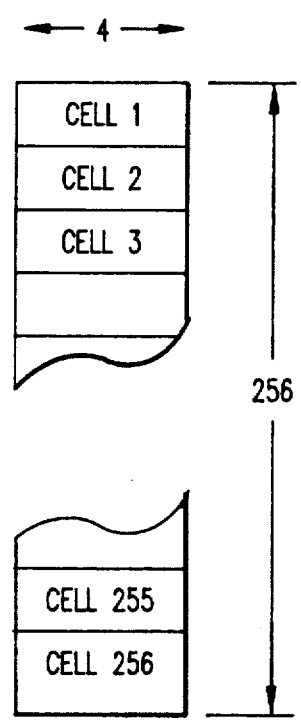
FIG. 2 is an illustration of the memory cell configuration in the NVRAM of the controller of FIG. 1.
Figure 3:
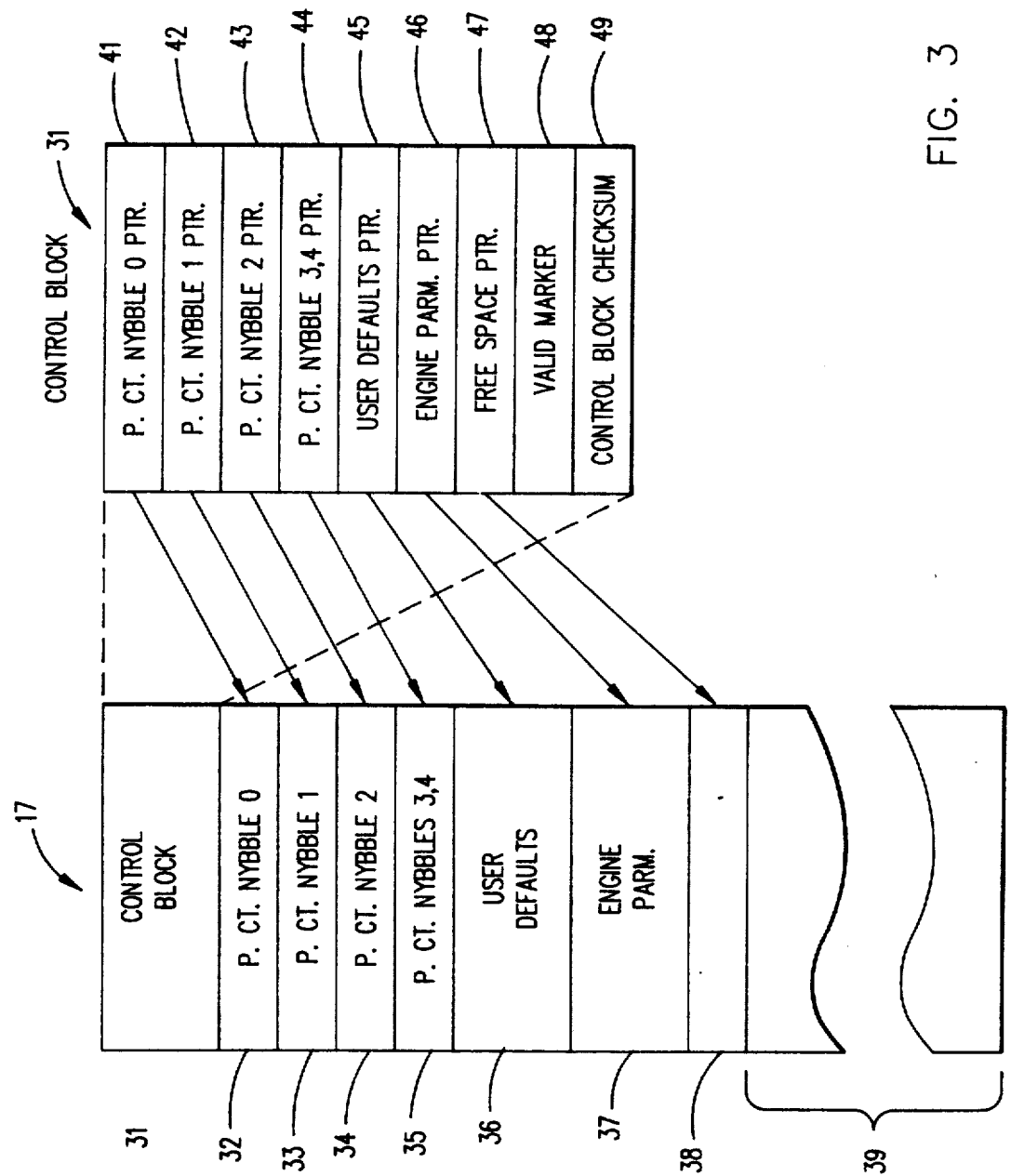
FIG. 3 is an illustration of the control block in the NVRAM of FIG. 2 and of the pointers in the control block to data areas in the NVRAM.

With reference now to FIG. 2, the EEPROM in the NVRAM, and the chip RAM which is co-extensive therewith, is made up of a number of binary digits, or bits, of storage. In the illustrated NVRAM chip, there are 1,024 bits. The NVRAM memory (both EEPROM and chip RAM) is structured in memory cells. In the illustrated NVRAM, there are 256 memory cells, or nybbles, with each cell 4 bits wide. The present EEPROM is rated for 5,000 change operations at any given bit before the bit fails. With additional reference now to FIGS. 3 and 4, in accordance with the invention the NVRAM memory is divided into a control block portion and a data portion. The control block in the present NVRAM is located at the top of the memory, followed by additional blocks of information maintained in the memory, followed by unused memory cells. In this NVRAM, the memory cells are 4 bit nybbles, and memory blocks contain one or more nybbles. The NVRAM arrangement of FIG. 3 is the memory architecture of the EEPROM 17, and the chip RAM is similarly arranged. In this structure, the EEPROM is divided into a control block 31, four page count blocks 32-35, a user default block 36, a print engine parameter block 37, and unused nybbles 38,39.

The present control block is made up of 9 bytes, 7 of which contain pointers to blocks in the information area of the EEPROM 17. The page counter block 32 contains the least significant page count nybble, the memory block 33 contains the next least significant page count nybble, the block 34 contains the next least significant page count nybble, and the block 35 contains the two most significant page count nybbles. The block 36 contains user default parameters, and the block 37 contains print engine parameters. The block 38 is the first unused nybble, and reference numeral 39 refers to the balance of the unused memory cells.

The control block 31 contains 9 storage areas, each of which contains 2 nybbles (one byte). The first 7 bytes in the control block contain pointers to the blocks 32-38 in the EEPROM 17. Bytes 41-44 point to the page count blocks 32-35, respectively. The byte 45 contains a pointer to the user default block 36, the byte 46 contains a pointer to the print engine parameter block 37, and the byte 47 contains a pointer to the first unused nybble 38 in the EEPROM. Additional pointers could be added to the control block 31 to point to additional memory areas in the EEPROM 17, should they be needed.

The control block 31 also contains a valid marker byte 48, which contains a fixed constant to facilitate identification by the microprocessor of a control block containing valid data. The control block also contains a checksum byte 49, for assuring data integrity. The checksum is based upon an arithmetic sum of all the data in the control block, and the checksum changes when there is a change to the control block information.

In using the NVRAM for storing a count of the number of pages printed by the printer, if the microprocessor updates a page count in RAM each time a page is printed, but only stores a count change in the NVRAM every second page, the least significant page count nybble (the nybble 0) would be subject to failure after only 10,000 pages had been counted if the NVRAM were rated for 5,000 changes at any bit location. This would be much earlier than the life of the printer, which might be on the order of 300,000 pages. The present invention provides the ability to extend the page counter use of the NVRAM beyond a first bit failure by the dynamic relocation of the page counter nybble 0 (as well as other data blocks) into the unused memory area 38,39.

Figure 4:
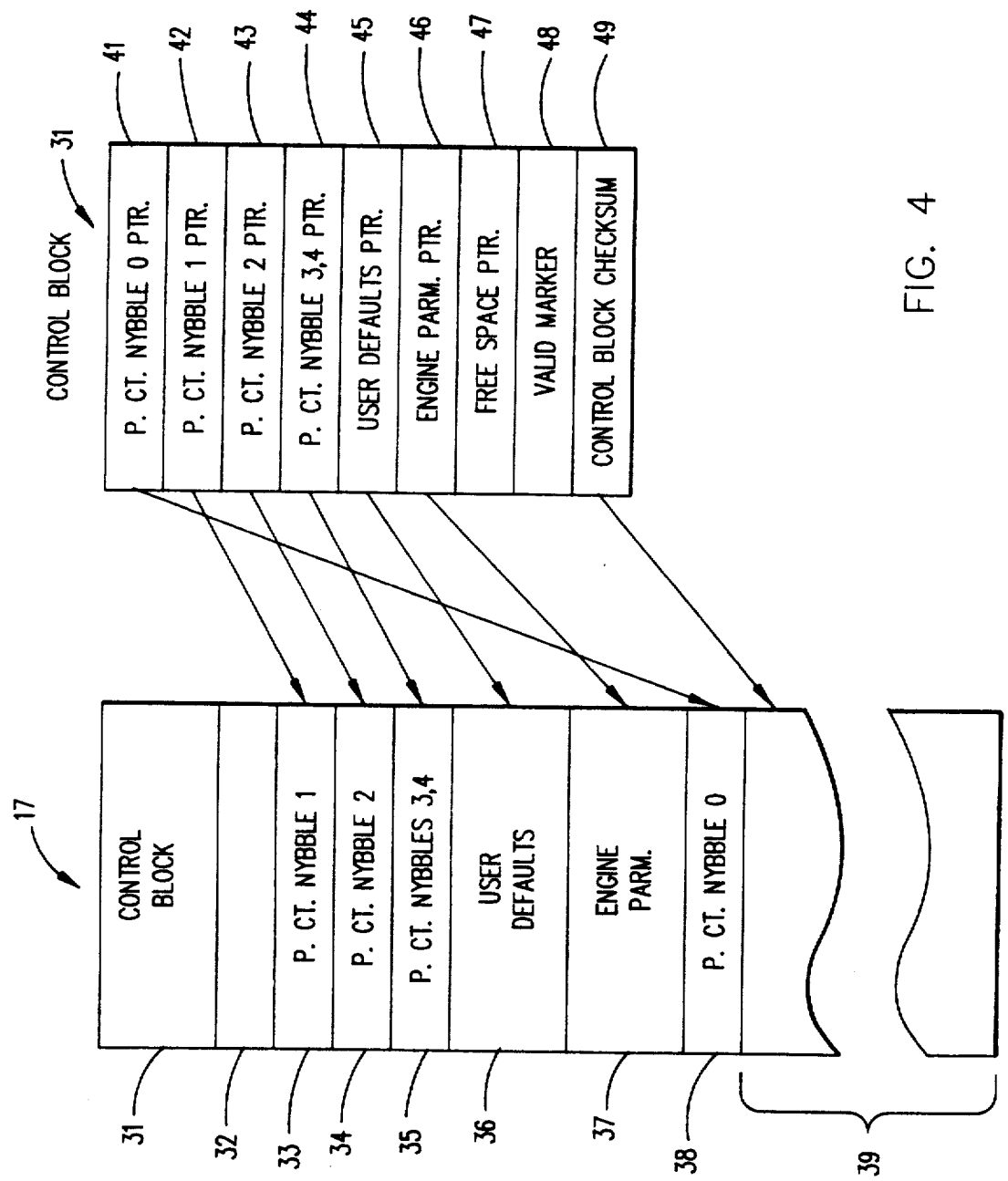
FIG. 4 is an illustration similar to that of FIG. 3 in which the control block pointer information has been changed.

Referring additionally to FIG. 4, if a failure is detected in the memory block 32, the data associated with page counter nybble 0 is moved to the next available memory block, in this case the memory block 38.

Certain changes to the control block 31 are also required to effect the movement of the page count nybble 0 to the memory block 38. First, the page count nybble 0 pointer information in the byte 41 of the control block is changed to point to the new (page count nybble 0) block 38. Second, the free space pointer 47 information is changed to point to the top of the unused area 39 of the EEPROM 17. Finally, since the control block data has changed, a new checksum must be calculated and placed in the checksum byte 49.

The data block contents in the EEPROM 17 can be changed as required by the microprocessor without affecting the control block until the next defective memory cell is detected. The defective memory location can be in the page count nybbles or elsewhere in the EEPROM. The defective memory cell error recovery continues until a failure is detected and the number of free cells is insufficient to allow for relocation of the affected data block. Since the control block 31 is modified only once per relocation operation, it is well within the limits of the NVRAM and should never need to be relocated.

Figure 5:
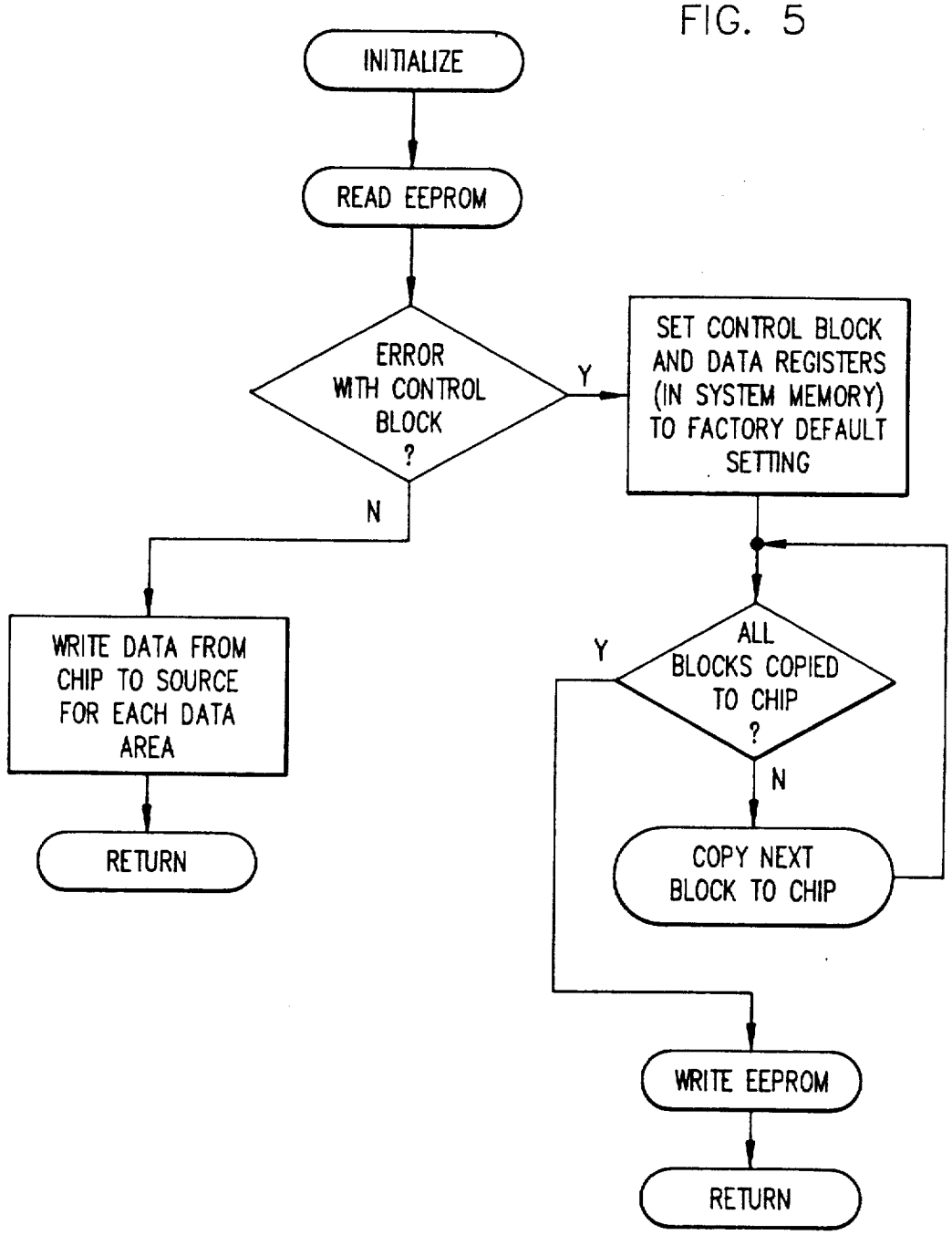
FIG. 5 is a flow chart of the NVRAM initialization routine executed by the microprocessor of FIG. 1.
Figure 6:
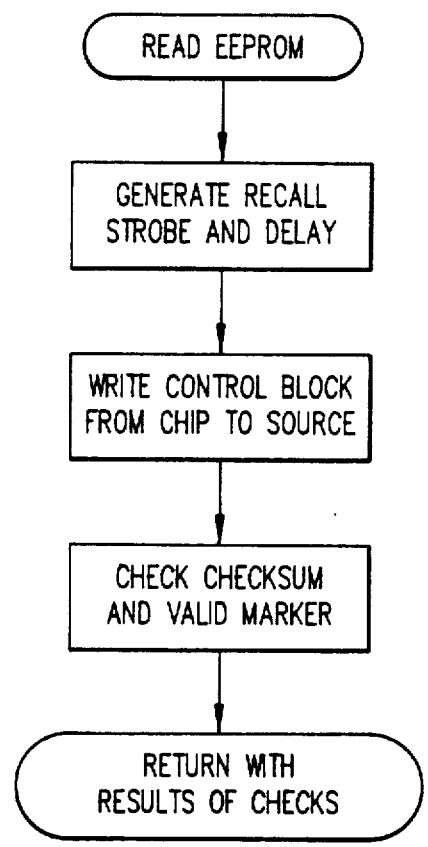
FIG. 6 is a flow chart of a routine employed by the operation of FIG. 5 for reading information from the EEPROM of the NVRAM.

With further reference to FIGS. 5-10, the operation of the microprocessor 12 under program control is illustrated to facilitate an understanding of the manner in which the NVRAM is managed. With particular reference to FIG. 5, when the page printer is powered on, the microprocessor performs an initialization routine with regard to the NVRAM. As a first step the "read EEPROM" routine of FIG. 6 is executed. The contents of the EEPROM 17 are read into the chip RAM 18 (FIG. 1) in response to a recall strobe from the microprocessor to the NVRAM 16. This places the information stored in the EEPROM during power off into the chip RAM if the printer has previously been powered on. The processor is then able to read the contents of the EEPROM 17 by accessing the chip RAM, which now contains a copy of the EEPROM information. The processor then writes the control blocks information from the chip RAM to the processor RAM, referred to in the flowcharts as the "source" RAM. The processor next determines if the valid marker in the control block matches a preset value stored in the ROM 13. The processor also calculates the checksum for the control block and compares it to the value in the control block checksum byte. The routine then returns to the initialization routine of FIG. 5 with the results of these checks.

If the valid marker and checksum checks indicate an error, the processor sets the control block and other data values in the source RAM to factory default settings. The control block factory default settings are copied from the ROM 13. The data registers in source RAM, such as user defaults and print engine parameters, are also obtained from the ROM 13.

The processor next copies the control block to the chip RAM and then copies the other blocks (blocks 32-37 in FIG. 3, for example). To copy this data to the chip RAM, the processor uses a "copy" routine illustrated in FIG. 7. If the chip RAM contains the same data as the source RAM, the copy routine merely returns. If the chip RAM data differs from the source RAM data, the source data is written to the chip RAM, and the routine returns with an indication that a change has been made. The processor then issues a "store" strobe on the line 20 to transfer the information in the chip RAM 18 to the EEPROM 17. This constitutes one write to the EEPROM. This particular write during initialization should only occur when the printer is first powered on after assembly. In writing to the EEPROM, additional steps are required to insure that the data written has been accurately placed in the EEPROM and that no cell failures have occurred. The more detailed description of the operation of writing to the EEPROM will be discussed subsequently with regard to the main operation of the NVRAM memory management process.

If, as is usually the case, after reading the EEPROM there is no error in the control block information in the chip RAM, the data from the chip RAM is written to the appropriate locations in the microprocessor RAM memory 14. At this point additional verification of the data may or may not be performed as required. Initialization is then complete.

Figure 9:
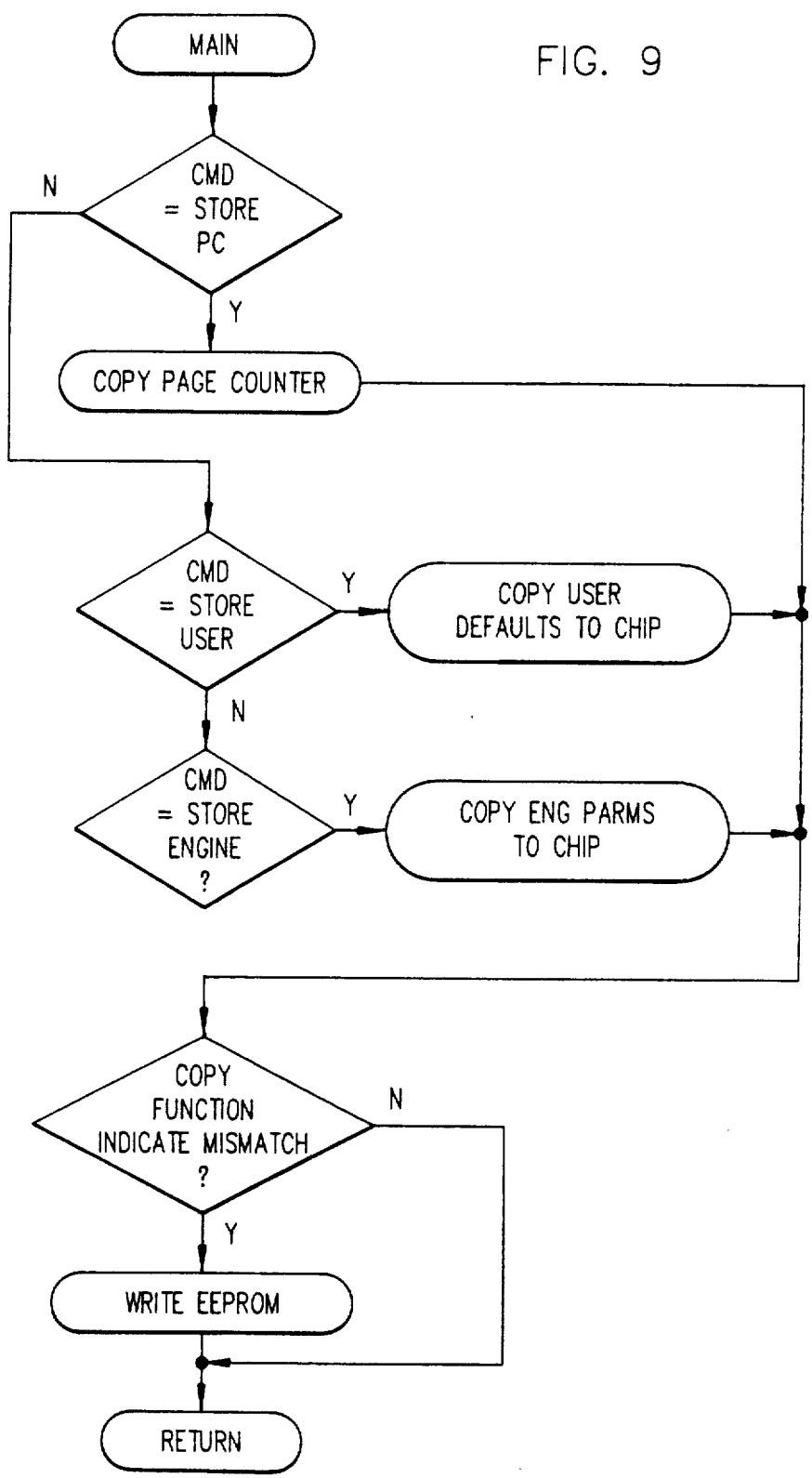
FIG. 9 is a flow chart of the main NVRAM management routine executed by the microprocessor of FIG. 1.

Considering the main NVRAM management routine of FIG. 9, the routine is executed for writing data to the chip RAM and, if necessary, for writing data to the EEPROM. The main routine is called for updating the page counter information, or, less frequently, for changing user defaults or print engine parameters.

Figure 10:
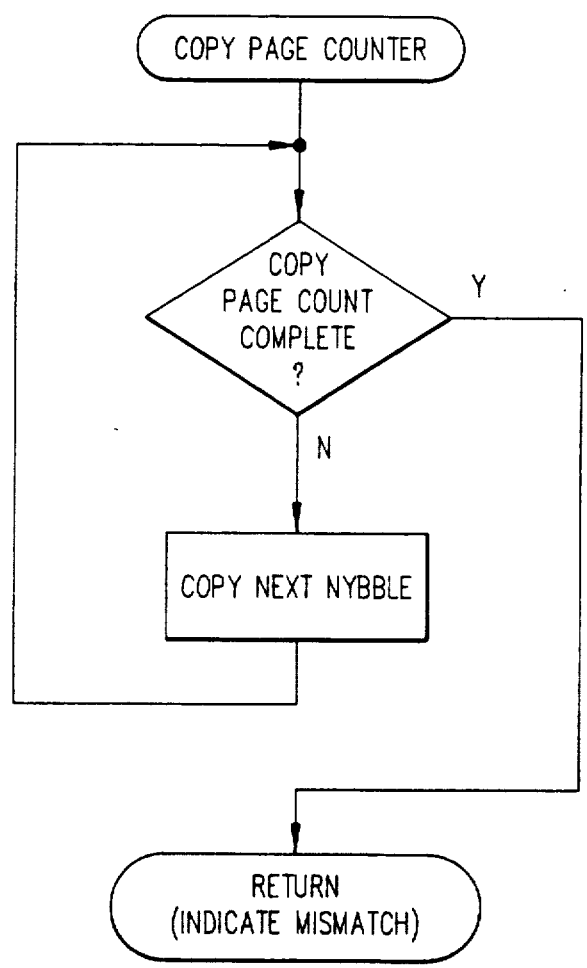
FIG. 10 is a flow chart of a routine for copying page count information to the NVRAM employed by the routine of FIG. 9.

If the main routine has been called to store page counter information, the processor executes a "copy page counter" subroutine, as illustrated in FIG. 10. To do this, the processor copies each nybble of the page count data from the control block area of the RAM 14 to the control block area in the chip RAM 18. The subroutine then returns to the main routine, providing an indication if there was a mismatch. If there was a mismatch, a "write" to the EEPROM will be required, which is typically the case when the page counter is updated.

If the main routine was not called for updating the page counter, the processor next determines if the request was to store user defaults. If so, the user default information is copied to the chip RAM and any mismatch of the data is indicated. If the main routine was called to store print engine defaults, the engine parameters are copied to the chip RAM, with an indication of mismatch if the source data is not the same as the chip RAM data.

After whatever data is required has been written to the chip RAM, the processor determines if a mismatch has been indicated. If not, nothing need be written to the EEPROM, and the routine returns. If there has been a change, then data must be written to the EEPROM, utilizing the routine of FIG. 8.

When writing data to the EEPROM, the processor first generates the "store" strobe on the line 20 and delays for a suitable time to allow the contents of the chip RAM to be transferred to the EEPROM. The processor then reads the EEPROM, using the routine of FIG. 6, to transfer the EEPROM data to the chip RAM. In the routine of FIG. 6, the processor also writes the control block from the chip RAM to the source RAM 14, and checks the checksum and valid marker. The results of these checks are returned to the routine of FIG. 8.

If the result of either of these checks is a mismatch, then there has been a non-recoverable error in the NVRAM. This situation can only occur when the NVRAM memory does not allow for sufficient changes. The number of changes to the control block is much less than the typical rating of 5,000 (or more) changes for the NVRAM, so a non-recoverable error should only occur in the case of a defective NVRAM chip.

Figure 7:
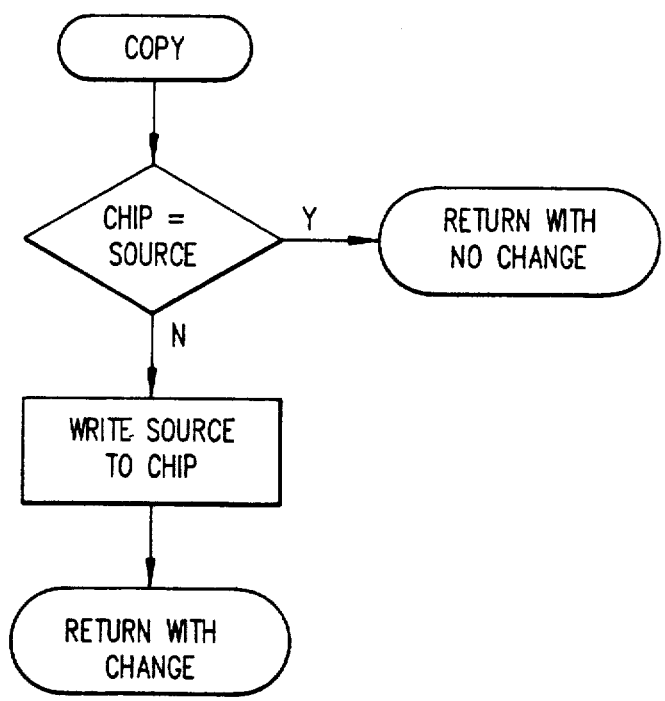
FIG. 7 is a flow chart of a routine for copying information to the NVRAM which is employed by the operation of FIG. 5.
Figure 8A:
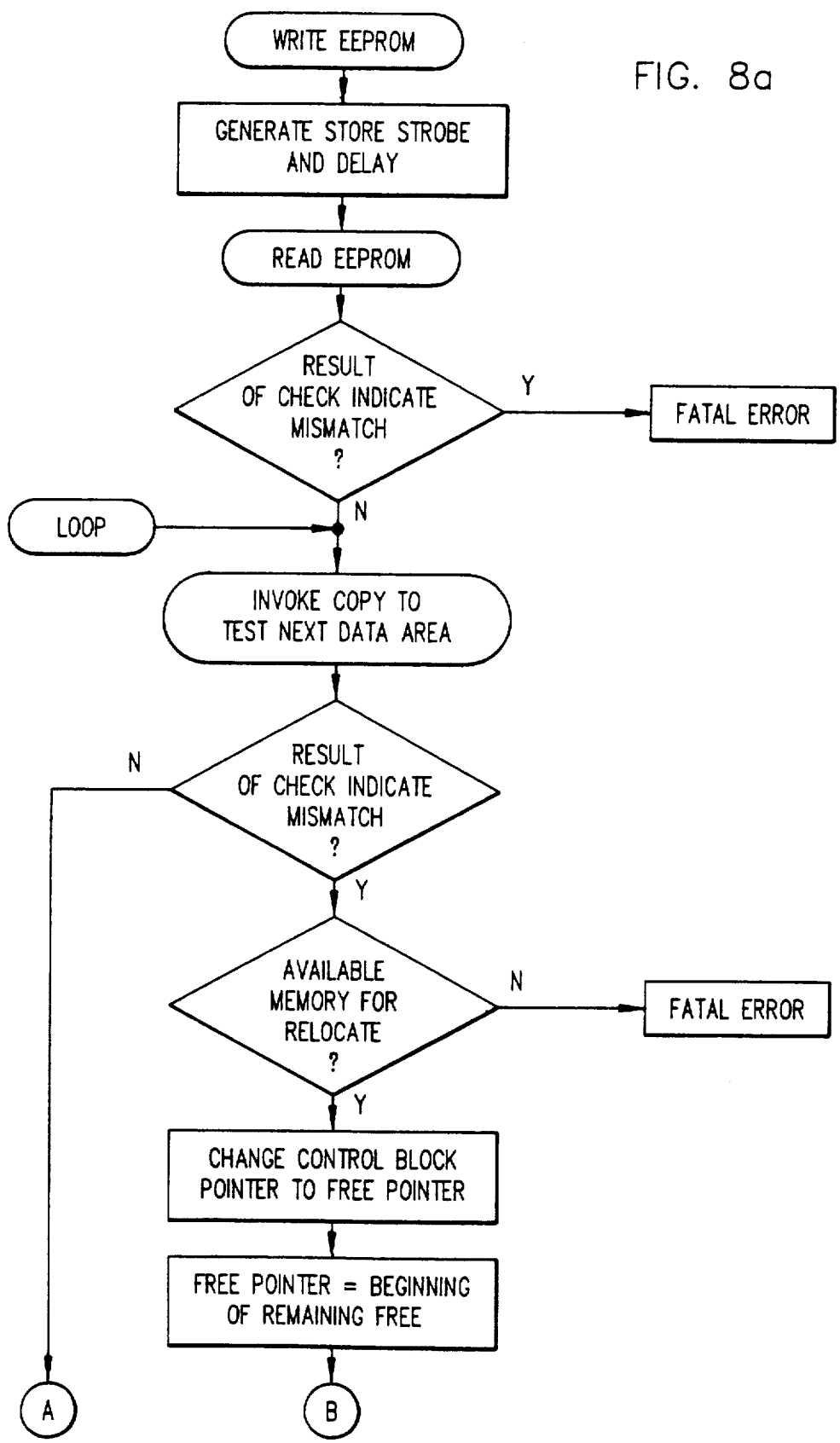
FIGS. 8A and 8B are a flow chart of a routine for writing data to the EEPROM of the NVRAM employed by the operation of FIG. 5.
Figure 8B:
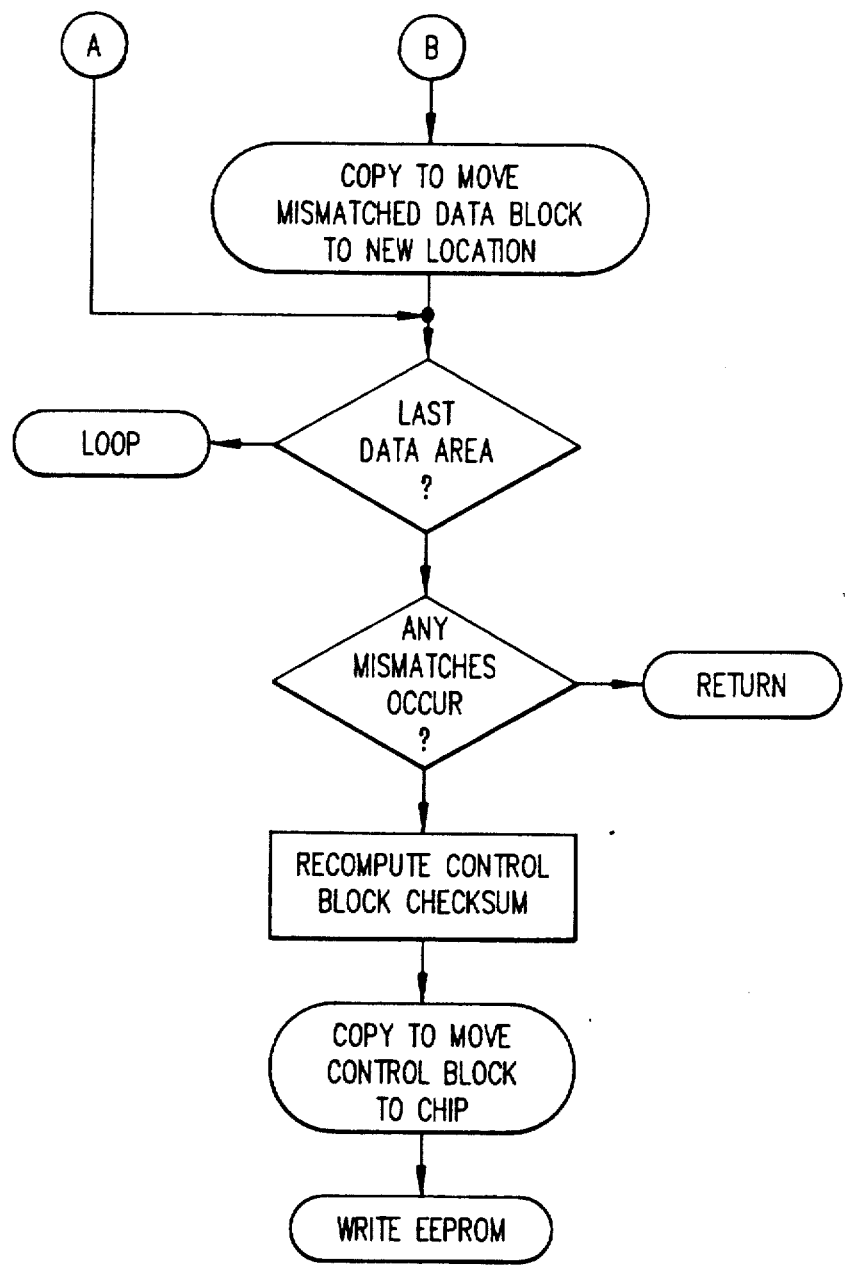

In the typical event, that the control block information is satisfactory, the processor next uses the copy routine of FIG. 7 to test each data area in the chip RAM to see that it corresponds to the source data in the RAM 14. This should be the case if a successful "write" to the EEPROM has occurred. As each data area is checked, if there is no mismatch of data, the processor loops through the test until reaching the last data area. If no mismatches have occurred, the routine returns.

If a mismatch is indicated in executing this loop, the processor determines if there is memory available in the EEPROM for relocation of the mismatched block. If not, there is a fatal error, which is indicated by the printer.

If there is memory available for relocation of mismatched data, the processor changes the control block pointer for the mismatched block to the value of the free pointer. The free pointer is then incremented to the beginning of the remaining free area, offset from its previous value by the amount of memory needed for the relocated block. The copy subroutine of FIG. 7 is then used to write the source RAM data for the mismatched data block to the new location in the chip RAM.

After the last data has been checked, if there has been a mismatch of one or more data blocks, the processor proceeds to write the updated chip RAM information to the EEPROM. First, the processor recomputes the control block checksum so that it is correct for the changed control block in RAM. The processor then uses the copy subroutine of FIG. 7 to move the control block information to the chip RAM.

Next the processor re-executes the "write EEPROM" routine. This should result in the correct information being written to the EEPROM. However, if another mismatch occurs, the routine is executed again. As noted above, when no mismatches occur, the routine returns, in this case to the main routine of FIG. 9. The main routine is then complete and returns to the function which called the routine.

What is claimed is:

1. A page printer controller comprising:
    a non-volatile memory including a control block portion and a data portion;
    means for storing data in the data portion of the non-volatile memory at a location indicated by the value of a pointer in the control block portion of the non-volatile memory;
    means for determining if data has not been stored accurately in the non-volatile memory; and
    means for changing the value of the pointer in the control block portion of the non-volatile memory if data has not been stored accurately in the non-volatile memory to thereby change the location in the data portion of the non-volatile memory indicated by the pointer in the control block portion, the means for storing data being operable to store data that was not stored accurately at the location indicated by the changed value of the pointer in the control block portion of the non-volatile memory.

2. The page printer controller of claim 1 in which the means for storing data comprises means for storing data in the data portion of the non-volatile memory at a plurality of locations indicated by the values of a plurality of pointers in the control block portion of the non-volatile memory, the means for changing the value of the pointer comprising means for changing the values of any of the pointers in the control block portion of the non-volatile memory if data whose location is indicated by that pointer is not stored accurately in the non-volatile memory.

3. A page printer comprising a print engine and a printer controller, the printer controller including:
    a non-volatile memory including a control block portion and a data portion;
    means for storing data in the data portion of the non-volatile memory at a location indicated by the value of a pointer in the control block portion of the non-volatile memory;
    means for determining if data has not been stored accurately in the non-volatile memory; and
    means for changing the value of the pointer in the control block portion of the non-volatile memory if data has not been stored accurately in the non-volatile memory to thereby change the location in the data portion of the non-volatile memory indicated by the pointer in the control block portion, the means for storing data being operable to store data that was not stored accurately at the location indicated by the changed value of the pointer in the control block portion of the non-volatile memory.

4. The page printer of claim 3 in which the means for storing data comprises means for storing data in the data portion of the non-volatile memory at a plurality of locations indicated by the values of a plurality of pointers in the control block portion of the non-volatile memory, the means for changing the value of the pointer comprising means for changing the values of any of the pointers in the control block portion of the non-volatile memory if data whose location is indicated by that pointer is not stored accurately in the non-volatile memory.

5. The page printer of claim 4 in which the means for storing data comprises means for storing printed page count data.

6. A page printer controller comprising:
    a non-volatile memory including a control block portion and a data portion;
    a volatile memory;
    means for storing data, read from the volatile memory, in the data portion of the non-volatile memory at a location indicated by the value of a pointer in the control block portion of the non-volatile memory;
    means for comparing the stored data in said indicated location in the data portion of the non-volatile memory with said data in the volatile memory and for providing an indication of a mismatch between said stored data and said data from the volatile memory;
    means for changing the value of the pointer in the control block portion of the non-volatile memory in response to said indication of a mismatch to thereby change the location in the data portion of the non-volatile memory indicated by the pointer in the control block portion; and
    means for storing said data in the volatile memory in the data portion of the non-volatile memory at the location indicated by the changed value of the pointer in the control block portion of the non-volatile memory.

* * * * *